(12) United States Patent
Eisner et al.

(10) Patent No.: US 9,679,739 B2
(45) Date of Patent: Jun. 13, 2017

(54) COMBINED ELECTROSTATIC LENS SYSTEM FOR ION IMPLANTATION (71) Applicant: Axcelis Technologies, Inc., Beverly, MA (US)

(72) Inventors: Edward C. Eisner, Lexington, MA (US); Bo H. Vanderberg, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 14/978,089

(22) Filed: Dec. 22, 2015

(65) Prior Publication Data

US 2016/0189912 A1    Jun. 30, 2016

Related U.S. Application Data

(60) Provisional application No. 62/096,975, filed on Dec. 26, 2014.

(51) Int. Cl.
| | |
|---|---|
| H01J 37/00 | (2006.01) |
| H01J 37/12 | (2006.01) |
| H01J 37/05 | (2006.01) |
| H01J 37/147 | (2006.01) |
| H01J 37/20 | (2006.01) |
| H01J 37/30 | (2006.01) |
| H01J 37/317 | (2006.01) |

(52) U.S. Cl.
CPC .............. *H01J 37/12* (2013.01); *H01J 37/05* (2013.01); *H01J 37/1472* (2013.01); *H01J 37/20* (2013.01); *H01J 37/30* (2013.01); *H01J 37/3171* (2013.01); *H01J 2237/31705* (2013.01)

(58) Field of Classification Search
CPC .. H01J 37/12; H01J 37/20; H01J 37/05; H01J 37/1472; H01J 37/3171; H01J 37/30; H01J 2237/31705
USPC ................................ 250/396 R, 492.1–492.3
See application file for complete search history.

(56) References Cited

U.S. PATENT DOCUMENTS

| | | | |
|---|---|---|---|
| 7,135,691 B2 | 11/2006 | Vanderpot et al. | |
| 2009/0121149 A1* | 5/2009 | Radovanov | H01J 37/12 250/396 R |
| 2010/0065761 A1* | 3/2010 | Graf | H01J 37/147 250/492.21 |

(Continued)

*Primary Examiner* — Michael Maskell
(74) *Attorney, Agent, or Firm* — Eschweiler & Potashnik, LLC (57) ABSTRACT

A system and method are provided for implanting ions at low energies into a workpiece. An ion source configured to generate an ion beam is provided, wherein a mass resolving magnet is configured to mass resolve the ion beam. The ion beam may be a ribbon beam or a scanned spot ion beam. A mass resolving aperture positioned downstream of the mass resolving magnet filters undesirable species from the ion beam. A combined electrostatic lens system is positioned downstream of the mass analyzer, wherein a path of the ion beam is deflected and contaminants are generally filtered out of the ion beam, while concurrently decelerating and parallelizing the ion beam. A workpiece scanning system is further positioned downstream of the combined electrostatic lens system, and is configured to selectively translate a workpiece in one or more directions through the ion beam, therein implanting ions into the workpiece.

20 Claims, 5 Drawing Sheets

(56) References Cited

U.S. PATENT DOCUMENTS

2013/0264498 A1\* 10/2013 Chang ................ H01J 37/3171
                                                                         250/492.21

\* cited by examiner

COMBINED ELECTROSTATIC LENS SYSTEM FOR ION IMPLANTATION

REFERENCE TO RELATED APPLICATION

This application claims priority to and the benefit of U.S. Provisional Application Ser. No. 62/096,975 which was filed Dec. 26, 2014, entitled "COMBINED ELECTROSTATIC LENS SYSTEM FOR ION IMPLANTATION", the entirety of which is hereby incorporated by reference as if fully set forth herein.

FIELD OF THE INVENTION

The present invention relates generally to ion implantation systems and methods, and more specifically to concurrently electrostatically deflecting, decelerating, parallelizing, and filtering an ion beam.

BACKGROUND OF THE INVENTION

Ion implanters are conventionally utilized to place a specified quantity of dopants or impurities within semiconductor workpieces or wafers. In a typical ion implantation system, a dopant material is ionized, therein generating a beam of ions. The ion beam is directed at a surface of the semiconductor wafer to implant ions into the wafer, wherein the ions penetrate the surface of the wafer and form regions of desired conductivity therein. For example, ion implantation has particular use in the fabrication of transistors in semiconductor workpieces. A typical ion implanter comprises an ion source for generating the ion beam, a beamline assembly having a mass analysis apparatus for directing and/or filtering (e.g., mass resolving) ions within the beam, and a target chamber containing one or more wafers or workpieces to be treated.

Various types of ion implanters allow respectively varied dosages and energies of ions to be implanted, based on the desired characteristics to be achieved within the workpiece. For example, high-current ion implanters are typically used for high dose implants, and medium-current to low-current ion implanters are utilized for lower dose applications. An energy of the ions can further vary, wherein the energy generally determines the depth to which the ions are implanted within the workpiece, such as to control junction depths in semiconductor devices. Typically, low- to medium-current implanters have a substantial length of travel of the ion beam (also called the beamline of the implanter) before it impacts the workpiece. High-current implanters, however, typically have a much shorter beamline due, at least in part, to the low energies associated with the ion beam, wherein the high-current ion beams tend to lose coherence with longer beamlines.

As device geometries continue to shrink, shallow junction contact regions translate into requirements for lower and lower energies of the ion beam. Additionally, requirements for precise dopant placement have resulted in ever-more demanding requirements for minimizing beam angle variation, both within the beam, and across the substrate surface. For example, in certain applications, implants at energies down to 300 electron Volts are desirable, while concurrently minimizing energy contamination, maintaining tight control of angle variation within the ion beam as well as across the workpiece, and also while providing high workpiece processing throughput.

At present, several architectures exist to achieve low energies, however, these architectures typically utilize magnets to parallelize the ion beam after mass resolution. The presence and required configuration of the magnets, however, tends to provide a beamline that is longer than desirable, thus needing higher beam currents or energies to simply transport the ion beam through the apparatus. Accordingly, it can be appreciated that an improved beamline architecture is desirable for providing both a low dose implant with a minimal beamline length.

SUMMARY OF THE INVENTION

The present invention overcomes the limitations of the prior art by providing a system, apparatus, and method that provides control of purity, angle, and dosage for low energy implants with a relatively short beamline. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with the invention, an ion implantation system is provided, wherein the ion implantation system comprises an ion source configured to generate a beam of ions. The ion source, for example, may be configured to generate a spot ion beam or a ribbon beam. The ion implantation system further comprises a mass analyzer or mass resolving magnet configured to mass resolve the beam of ions. A mass resolving aperture is further positioned downstream of the mass analyzer, wherein the mass resolving aperture is configured to filter undesirable species from the ion beam.

According to one exemplary aspect of the invention, a combined electrostatic lens system is provided, wherein the combined electrostatic lens system is positioned downstream of the mass resolving magnet. The combined electrostatic lens system is configured to control a path of the ion beam downstream of the mass resolving magnet and to generally filter contaminants from the ion beam, while concurrently decelerating and parallelizing the ion beam. In accordance with one example, the ion implantation system further comprises a beam scanning system positioned downstream of the mass resolving magnet, wherein the beam scanning system is configured to scan the spot ion beam along a single beam scan plane, therein defining a scanned ion beam. Accordingly, the combined electrostatic lens system is further configured to parallelize the scanned ion beam into a plurality of parallel beamlets that travel at a decelerated speed and from which contaminants are generally removed. Further, the combined electrostatic lens system may comprise an electrostatic decelerating filter configured to selectively decelerate the ion beam.

The ion implantation system may further comprise a focusing element positioned downstream of the mass resolving aperture and upstream of the combined electrostatic lens system, wherein the focusing element generally determines a size of the ion beam. The ion implantation system, in another example, further comprises a space-charge neutralization system positioned downstream of the combined electrostatic lens system, wherein the space-charge neutralization system is configured to space-charge neutralize the ion beam. One or more energy slits may be further provided between the combined electrostatic lens system and the space-charge neutralization system, wherein an energy of the ion beam is made uniform by filtering ions having undesirable energies from the ion beam.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention is directed generally toward an ion implantation system and method for implanting ions in a workpiece, wherein a beam of ions is generally concurrently electrostatically parallelized, deflected, decelerated and filtered. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Figure 1A:
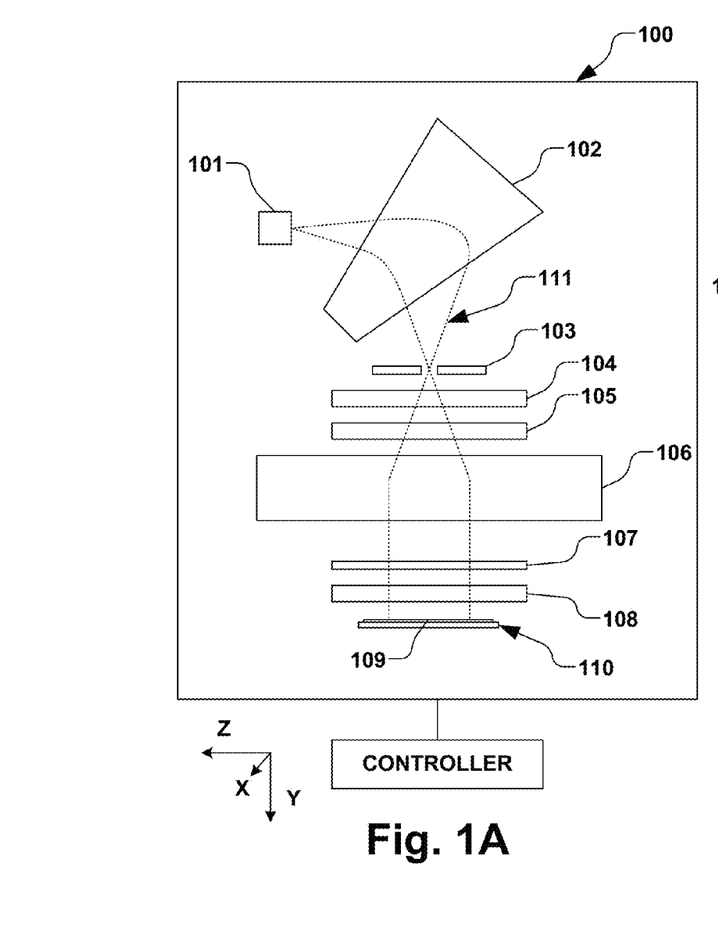
FIGS. 1A-1B are schematic diagrams illustrating an exemplary implantation system having a combined electrostatic lens system according to an aspect of the present invention.
Figure 1B:
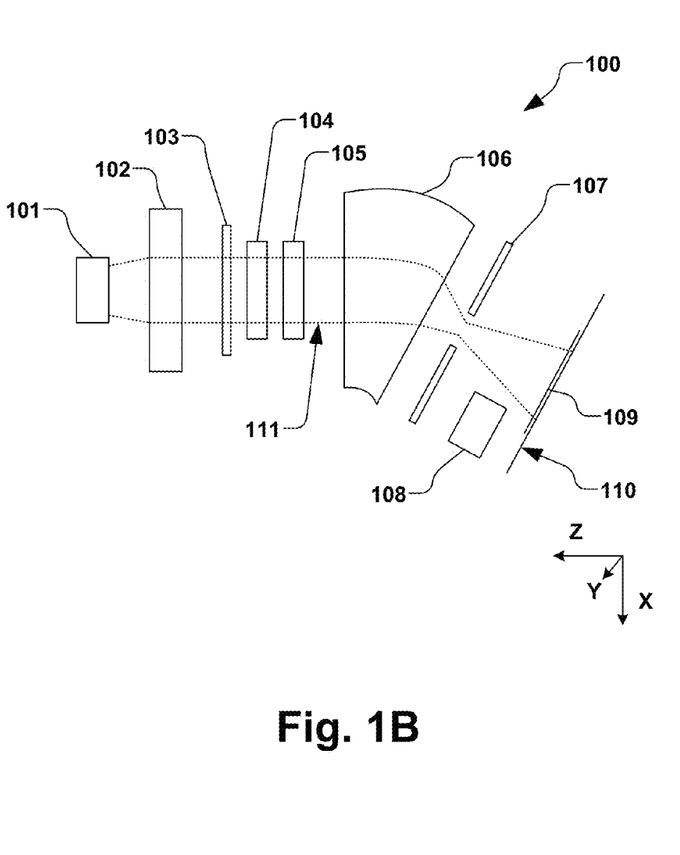

Referring now to the figures, FIGS. 1A-1B illustrate an exemplary ion implantation system 100 according to one aspect of the present invention. Those skilled in the art will recognize that the Figures are simplified and do not show all the subsystems (e.g., a vacuum system for a functional implanter, etc.). The ion implantation system 100 (also called an ion implanter), for example, comprises an ion source and extraction assembly 101, a mass-analysis magnet assembly 102, a mass resolving aperture 103, a focus and/or steering element 104, a scanner apparatus 105, a combined electrostatic lens system 106 (also called a parallelizing deflecting deceleration filter), an energy resolving system 107, a beam and workpiece neutralization system 108, and a workpiece 109 and workpiece holder and translation system 110.

The ion source and extraction system 101 is operable to produce an ion beam 111 at a defined energy, which is then transported through the succession of optical elements (e.g., the mass-analysis magnet assembly 102, mass resolving aperture 103, focus and/or steering element 104, and scanner apparatus 105). In the combined electrostatic lens system 106, the energy of the ion beam 111 can be reduced, or left the same, whereby the ion beam is further directed to the workpiece 109. It should be noted that the ion beam 111 can have a relatively narrow profile (e.g., a generally circular cross-section perpendicular to its propagation), hereinafter alternatively referred to as a "pencil" or "spot" ion beam, or an elongate profile (e.g., a generally ovular or rectangular cross-section perpendicular to its propagation), hereinafter alternatively referred to as a "ribbon" ion beam. In the case of the ion beam 111 being a pencil ion beam, the scanner apparatus 105 is configured to bend the ion beam in a direction perpendicular to the nominal beam propagation direction such that the pencil beam is swept across the workpiece 109. In the case of the ion beam 111 being a ribbon beam, the scanner apparatus 105 may be configured to merely dither the ribbon beam a small distance to reduce beam current non-uniformities in the ion beam.

The present invention contemplates the ion implantation system 100 being utilized for low energy implants, wherein the beamline (e.g., the length of the ion beam 111 from the ion source and extraction assembly 101 to the workpiece 109) is kept relatively short to reduce the impact of space-charge expansion (also called beam blow-up). The ion implantation system 100, for example, is configured for energies between 100 eV and 60 keV. To further reduce the impact of space-charge expansion, the ion beam 111 can be produced in the ion source and extraction system 101 at an energy that is higher than the desired implantation energy. The ion beam 111 is transported through as much of the ion implantation system 100 as possible at said higher energy, thus reducing space-charge expansion, as compared to a scenario where the ion beam were to be transported through the same distance, but at the implantation energy. Thus, before implantation, the energy of the ion beam 111 is reduced to the desired implantation energy.

The mass-analysis magnet assembly 102, in the present example, is generally formed at about a ninety degree angle and comprises one or more magnets (not shown), wherein the one or more magnets generally establish a dipole magnetic field within the mass analyzer. As the ion beam 111 enters the mass-analysis magnet assembly 102, it is correspondingly bent via the magnetic field such that ions of an inappropriate charge-to-mass ratio are generally rejected. More particularly, only ions having the correct charge-to-mass ratio are able to pass through the mass resolving aperture 103 and continue down the beamline. Other ions not having the correct charge-to-mass ratio collide with the walls (not shown) of the mass-analysis magnet assembly 102 and/or the mass resolving aperture 103. The ion beam 111, for example, generally diverges after passing through the mass resolving aperture 103.

Downstream of the mass analysis aperture 103, the focusing and/or steering element 104 may be further provided, wherein the focusing and/or steering element is configured to receive the mass analyzed ion beam 111 and to selectively focus and/or steer the ion beam. The focusing and/or steering element 104, for example, may comprise one or more quadrupole magnets (not shown in FIGS. 1A-1B) and the like, and can be designed with focusing properties in both dimensions transverse to the propagation direction of the ion beam 111, wherein this focusing can counteract the expansion of the beam size, thus providing good transmission of the ion beam through restrictions in the beam line, such as vacuum enclosures, apertures etc.

The scanner system 105 is further provided downstream of the focusing and/or steering element 104. In the case of the ion beam 111 being a pencil beam, for example, the scanner apparatus 105 is configured to bend the ion beam in a direction perpendicular to the nominal beam propagation direction such that the pencil beam is swept across the workpiece 109. By varying the speed of the sweep, a desired dose profile may be implanted into the workpiece 109. In most cases, it is desired to uniformly implant the workpiece 109, but in some cases, a particular, non-uniform dose profile is desired. In the case of the ion beam 111 being a ribbon beam, for example, the ion beam may be wide enough to implant the entire width of the workpiece 109. The scanner system 105, for example, may be configured to simply dither the ribbon beam a small distance to reduce beam current non-uniformities in the ion beam 111 to achieve the desired dose profile.

Neutral beam atoms may be produced in a region upstream of the combined electrostatic lens system 106 by charge-exchange collisions among ions and background or residual particles. If the ion beam 111 is generated at higher energy than the desired implantation energy, such neutral beam atoms will generally also have more energy than the desired implantation energy. More specifically, because these particles are electrically neutral, they can pass through the combined electrostatic lens system 106 unaffected (e.g., without being accelerated, decelerated, focused, bent or otherwise altered in speed and/or direction). If they can reach the workpiece 109, these particles can be implanted into the workpiece at undesired depths as their (unaffected) energy is higher than the desired implant energy. This neutral particle contamination, called energy contamination, can severely degrade the desired performance of resulting semiconductor devices.

One or more aspects of the present invention address neutral particle contamination, at least, by bending the beam of ions with one or more of the electrodes of the combined electrostatic lens system to deflect the ions away from the neutral contaminants within the beam. The decontaminated beam of ions, for example, may be deflected by an angle of between about 10 to 30 degrees from the path of the contaminants, which also happens to be the original path of the (contaminated) ion beam, as the contaminants are generally unaffected by the electrodes due to the contaminants being electrically neutral. The beam of ions is directed onto the workpiece to encounter select areas of the workpiece to be doped. It will be appreciated that some type of barrier can, for example, be placed in front of the stream of neutral particles to prevent the contaminants from encountering the workpiece or wafer.

It is advantageous to implant all parts of the workpiece 109 with ions striking the workpiece at the same angle. For example, in the case of the ion beam 111 being a ribbon beam, the ribbon beam may diverge from the resolving aperture, whereby beamlets constituting the ribbon span a range of angles across the ribbon beam. In the case of the ion beam 111 being a scanned pencil beam, the scanned pencil beam may also have a similar distribution of angles as the ion beam is scanned across the workpiece 109. In both types of ion beam 111, in order to make all the beamlets of a ribbon beam parallel, or to make the scanned pencil beam at each moment in time parallel to the others, it is desirable to parallelize the ion beam.

Figure 2:
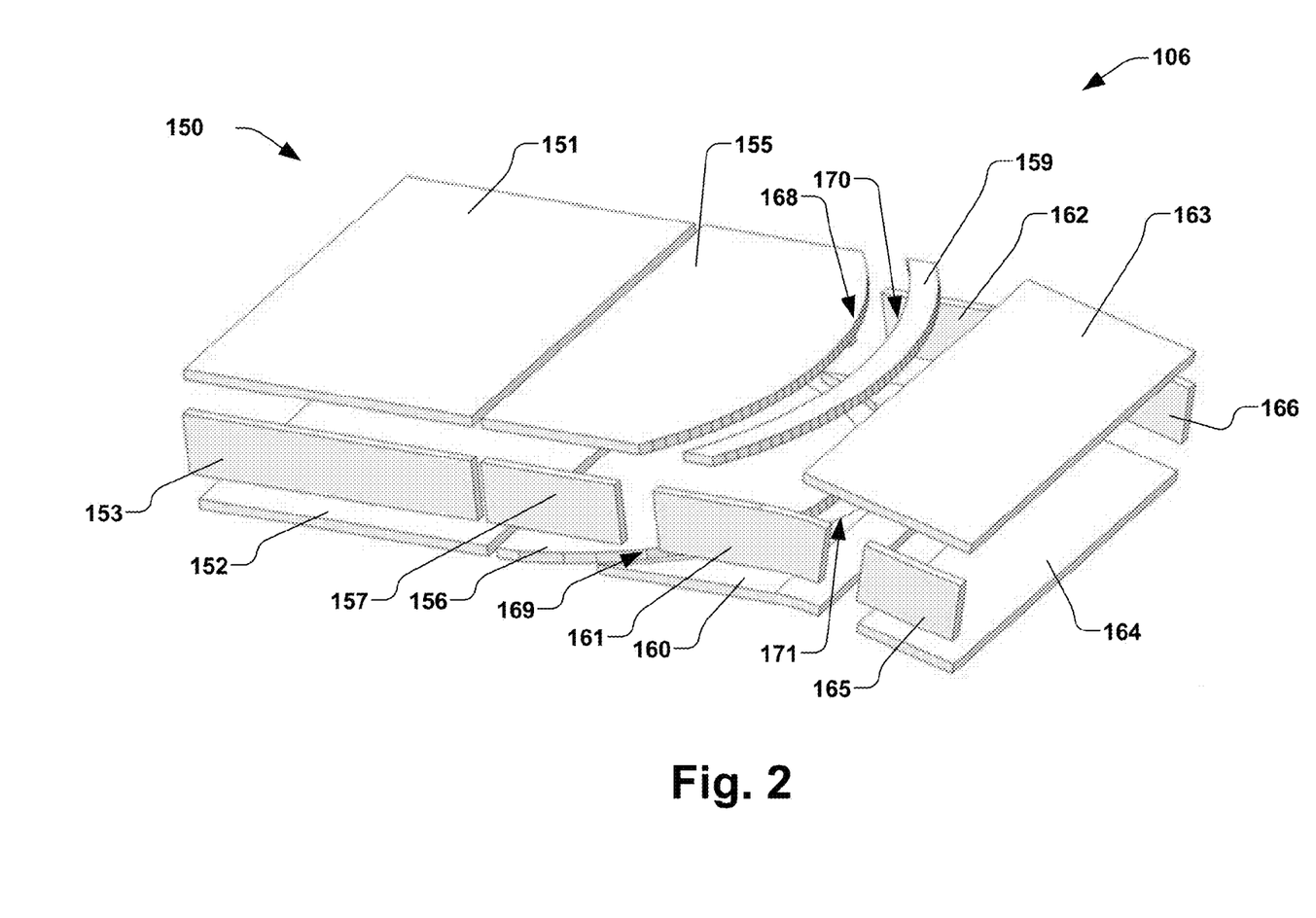
FIG. 2 is a three-dimensional schematic diagram of an exemplary implementation of the combined electrostatic lens system.

FIG. 2 illustrates one example of the combined electrostatic lens system 106 of FIGS. 1A-1B, whereby the combined electrostatic lens system comprises a representative set of electrodes 150 configured to parallelize, decelerate, deflect, and filter the ion beam 111. In the present example, the ion beam 111 of FIGS. 1A-1B enters the combined electrostatic lens system 106 of FIG. 2 from the left and exits to the right. For example, a top terminal electrode 151, bottom terminal electrode 152, and side terminal electrodes 153, 154 (side terminal electrode 154 shown in FIG. 3) generally define the walls or liners of the beamline and are biased to a potential more negative than ground (e.g., for a positively charged ion beam 111). A top terminal suppression electrode 155, bottom terminal suppression electrode 156, and side terminal suppression electrodes 157, 158 (side terminal suppression electrode 158 shown in FIG. 3), for example, serve multiple functions. The top terminal suppression electrode 155, bottom terminal suppression electrode 156, and side terminal suppression electrodes 157, 158, for example, are biased, on average, to a potential more negative than the terminal electrodes. The resulting electric field between the terminal electrodes 151, 152, 153, 154 and the terminal suppression electrodes 155, 156, 157, 158 generally prevents electrons from leaving the boundary thereof, and thus avoids beam blow-up in the ion beam 111 upstream of the combined electrostatic lens system 106 of FIGS. 1A-1B.

In the present example, a downstream edge 168, 169 of the respective top and bottom terminal suppression electrodes 155, 156 are curved. The downstream edges 168, 169 of the respective top and bottom terminal suppression electrodes 155, 156, for example, are further respectively matched to an upstream edge 170, 171 of a respective top bend electrode 159 and bottom bend electrode 160.

The top bend electrode 159, for example, can be either biased or grounded, but in either case, is more positive than the bottom bend electrode 160 and any of the terminal suppression electrodes 155, 156, 157, 158. The bottom bend electrode 160, for example, is biased negative and is more negative than the top bend electrode 159, but more positive than any of the terminal suppression electrodes 155, 156, 157, 158. An electric field produced in the region of these electrodes (e.g., the terminal suppression electrodes 155, 156, 157, 158 and bend electrodes 159, 160), for example, serves to parallelize, decelerate, and start to bend the ion beam 111 of FIGS. 1A-1B in order to filter neutrals from the ion beam.

Figure 3:
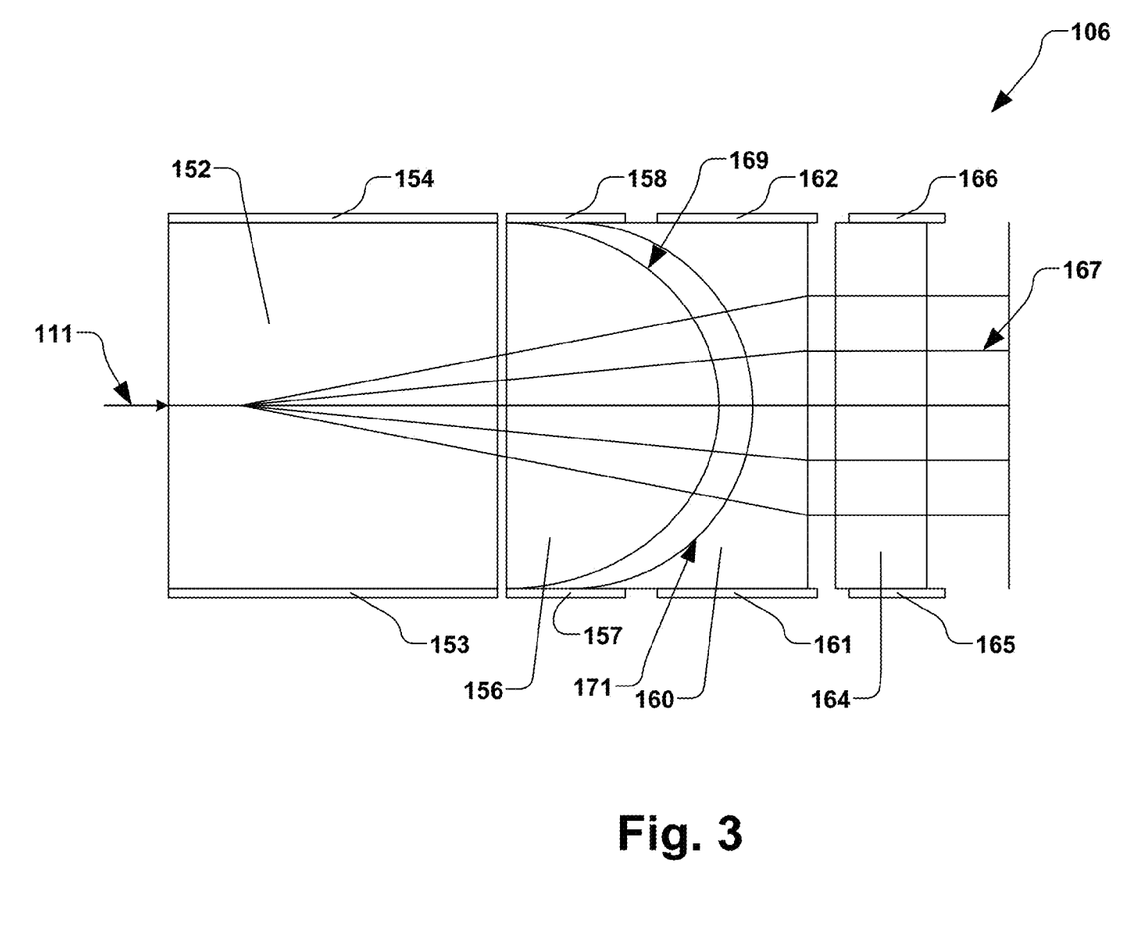
FIG. 3 is a top view of the schematic diagram of the combined electrostatic lens system of FIG. 2 with top electrodes removed to show the trajectories of example scanned ion beams.
Figure 4:
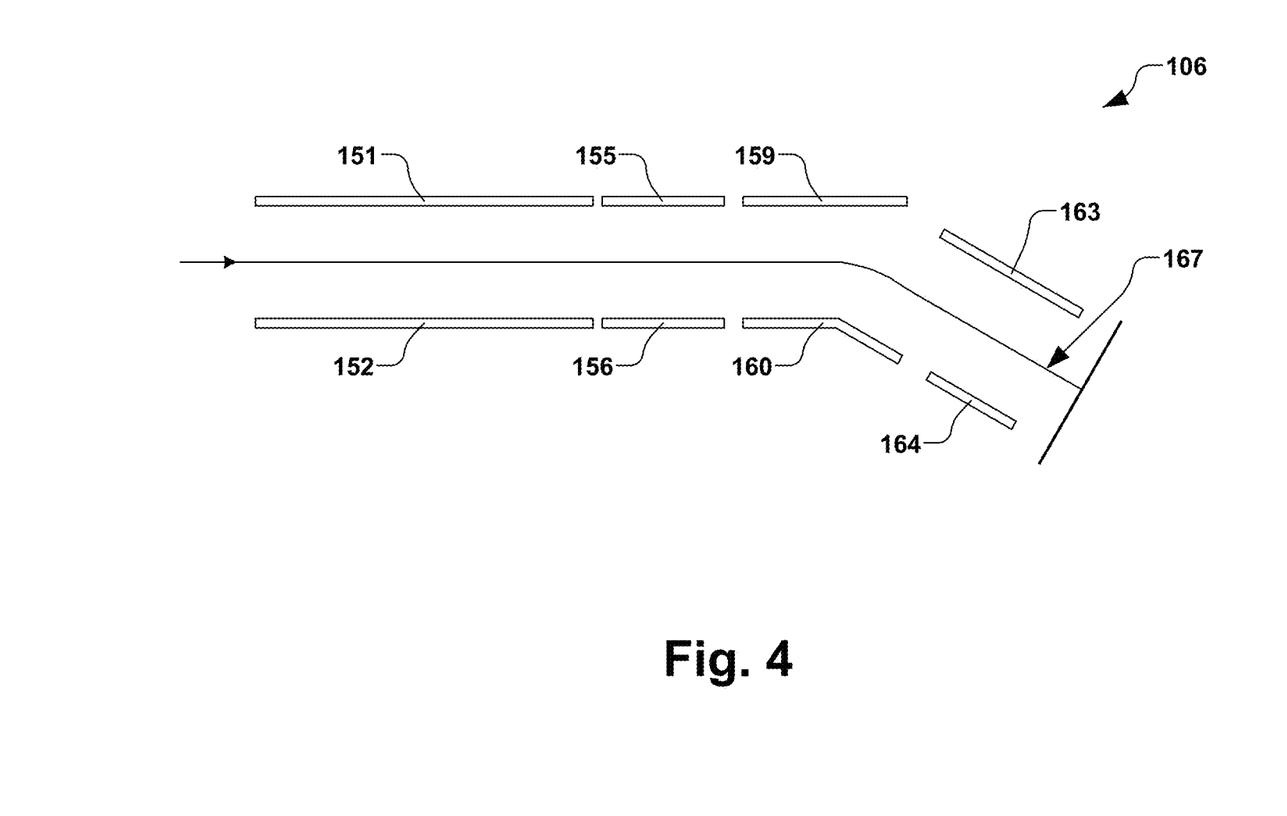
FIG. 4 is a side view of the schematic diagram of the combined electrostatic lens system of FIG. 2 with side electrodes removed to show the trajectories of example scanned ion beams.

As illustrated in FIGS. 2 and 3, the curvature of the downstream edges 168, 169 of the respective top and bottom terminal suppression electrodes 155, 156 and the curvature of the upstream edges 170, 171 of the respective top bend electrode 159 and bottom bend electrode 160, in conjunction with the potential difference between the terminal suppression electrodes 155, 156, 157, 158 and the top bend electrode, bottom bend electrode, and side bend electrodes 161, 162, serve to parallelize the ion beam. The average potential difference, regardless of the curvature, further causes the deceleration of the ion beam 111 of FIGS. 1A-1B. In accordance with one example, the curvature of the downstream edge 168 of the top terminal suppression electrode 155 is different than the curvature of the downstream edge 169 of the bottom terminal suppression electrode 156. Further, in another example, the curvature of the upstream edge 170 of the top bend electrode 159 differs from the curvature of the upstream edge 171 of the bottom bend electrode 160. Various configurations and differing curvatures of the downstream edges 168, 169 and respective upstream edges 170, 171 can be advantageously combined to provide the desired parallelization, deceleration, deflection, and filtering qualities in the combined electrostatic lens system 106. The electric field between the top bend electrode 159 and the bottom bend electrode 160 of FIGS. 2 and 3, for example, causes the ion beam 111 of FIGS. 1A-1B to bend downward. Such a bending of the ion beam 111 is illustrated in the beam trajectory 167 of FIG. 4.

Since the electric field between the top bend electrode 159 and bottom bend electrode 160 points substantially from the top to the bottom, the ion beam 111 will have more energy towards the bottom than towards the top. Thus, the parallelizing force is different from the top to the bottom, and the shapes of the parallelizing portions (e.g., the curvature of the downstream edges 168, 169 of the respective top and bottom terminal suppression electrodes 155, 156 and the curvature of the upstream edges 170, 171 of the respective top bend electrode 159 and bottom bend electrode 160) will be different. Such a difference in shape, for example, can be simply provided by a deviation in curvature, as shown in the FIGS. 2 and 3, or it could also be a curvature into or out of the page of FIG. 3. In another example, the terminal electrodes 151, 152, 153, 154, the terminal suppression electrodes 155, 156, 157, 158, and the bend electrodes 159, 160, 161, 162 can be provided in various combinations of a series of segments (not shown), each biased independently, in order to provide the desired electric field configuration.

Furthermore, in another example, ground electrodes 163, 164, 165, 166 may be provided, whereby, as their names imply, the ground electrodes can be electrically grounded or biased negatively (on average) to provide electron suppression if any of the bend electrodes 159, 160, 161, 162 are biased positively.

In accordance with another example, the combined electrostatic lens system 106 of FIGS. 1A-1B is configured to selectively further filter neutrals and other ions of non-desired energies out of the ion beam 111, wherein ion species of the desired energy will continue to follow the desired path of the ion beam and can be selectively decelerated or accelerated via the deceleration stage of the combined electrostatic lens system. Additionally, the combined electrostatic lens system 106 may further comprise electrostatic deflection plates (e.g., one or more pairs thereof) to selectively focus the ion beam 111. The combined electrostatic lens system 106 may further comprise an Einzel lens, quadrupoles and/or other focusing elements for focusing or steering the ion beam 111.

As illustrated in FIGS. 1A-1B, the beam and workpiece neutralization system 108, such as a plasma electron flood (PEF) component or plasma shower, may be further provided downstream of the combined electrostatic lens system for neutralizing a (positive) space charge that would otherwise accumulate on the workpiece 122 as a result of being implanted by the (positively) charged ion beam 111. One or more energy resolving slits (not shown) may be further provided by the energy resolving system 107 between the combined electrostatic lens system 106 and the beam and workpiece neutralization system (e.g., a space-charge neutralization system), wherein an energy of the ion beam 111 is made uniform by filtering ions having undesirable energies from the ion beam. A vacuum pump (not shown) may be further provided to evacuate the combined electrostatic lens system 106.

The combined electrostatic lens system 106 of the present invention is thus advantageous over prior magnet-based systems, as the present combined electrostatic lens system provides a greater degree of controllability, combined with a shorter overall beamline due, at least in part, to the configuration thereof.

In accordance with another exemplary aspect of the invention, the workpiece 109 and workpiece holder and translation system 110 illustrated in FIGS. 1A-1B, for example, comprises a "serial" type end station, wherein a single workpiece is translated through the path of the ion beam 111 via a workpiece scanning system for ion implantation thereto. Alternatively, the workpiece and workpiece holder and translation system 110 may comprise a "batch" type end station, wherein a plurality of workpieces may be placed on a spinning disk (not shown) and passed through the ion beam 111. In a preferred embodiment, the workpiece holder and translation system 110 is configured to support the single workpiece 109 and to mechanically scan the single workpiece in one or more dimensions or directions generally orthogonal to the ion beam path through the ion beam 111. The workpiece holder and translation system 110, for example, may comprise the two-dimensional scanning system described in U.S. Pat. No. 7,135,691 to Berrian et al., the contents of which are hereby incorporated by reference herein in its entirety. Alternatively, any workpiece scanning system capable of translating one or more workpieces 109 through the path of the ion beam 111 in one or more directions either orthogonally or non-orthogonally to the ion beam path is contemplated as falling within the scope of the present invention.

In accordance with yet another exemplary aspect of the disclosure, a controller 180 is operably coupled to the ion implantation system 100 for control of the system. For example, the controller 180 is operably coupled to, and configured to control, one or more the ion source and extraction assembly 101, mass-analysis magnet assembly 102, mass resolving aperture 103, focus and/or steering element 104, scanner apparatus 105, combined electrostatic lens system, energy resolving system 107, beam and workpiece neutralization system 108, and workpiece holder and translation system 110.

Accordingly, the ion implantation system 100 can be adjusted via the controller 180 in order to facilitate desired ion implantation based upon a desired dosage, current, and/or energy of ion implantation, as well as based on the one or more measured characteristics provided by a dosimetry system (not shown). In accordance with one example, the ion beam 111 can be initially established according to predetermined beam tuning parameters (e.g., predetermined beam tuning parameters may be stored/loaded into the controller 180). Then, based upon feedback from the dosimetry system, for example, the combined electrostatic lens system 106 can be adjusted control the parallelization, deceleration, deflecting, and/or filtering of the ion beam 111. Likewise, the energy level of the ion beam 11, for example, can be adapted to adjust junction depths by controlling a bias voltage applied to an extraction electrode of the ion source and extraction assembly 101 and/or to electrodes of the combined electrostatic lens system 106. In another example, the strength and orientation of magnetic field(s) generated in the mass-analysis magnet assembly 102 can be further controlled, such as by regulating the amount of electrical current running through field windings associated therewith, therein altering the charge-to-mass ratio of the ion beam 111. The angle of implantation and various other characteristics of the implantation may be further controlled via the controller, as will be understood by one of ordinary skill upon viewing the present disclosure.

Figure 5:
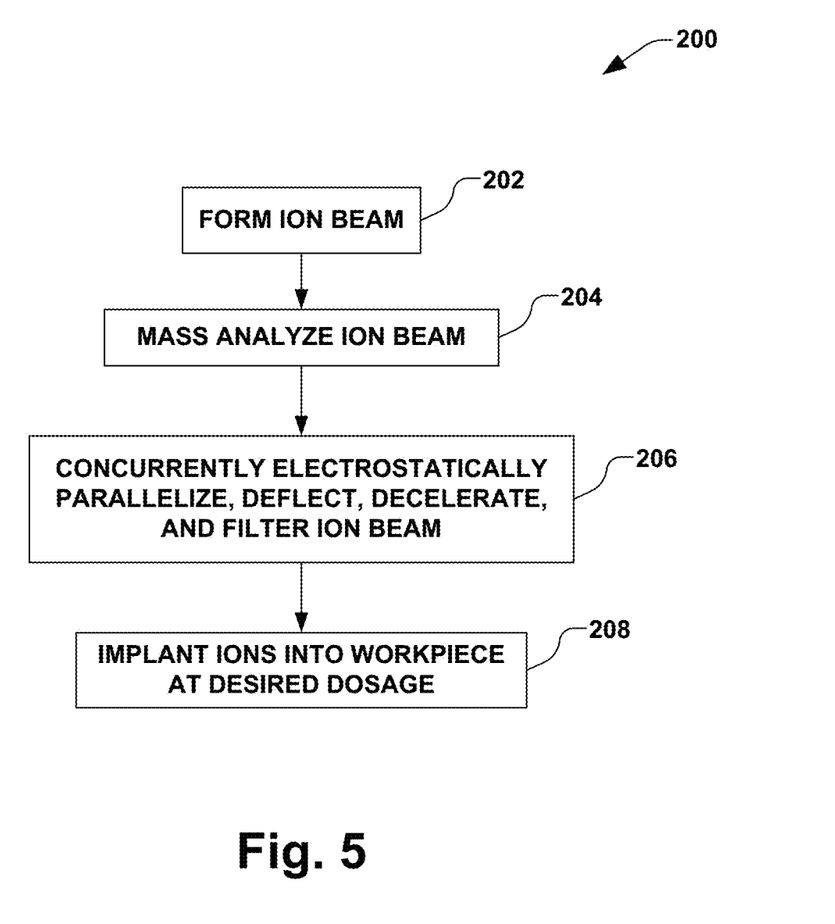
FIG. 5 illustrates an exemplary method for implanting ions into a workpiece in accordance with a further exemplary aspect of the present invention.

In accordance with another aspect of the present invention, FIG. 5 illustrates an exemplary method 200 for implanting ions into a workpiece. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 200 begins at act 202, wherein an ion beam is formed, such as the ion beam 111 formed via the implantation system 100 of FIGS. 1A-1B. The ion beam formed in act 202, for example, may be a low energy/high current ion beam. In act 204 of FIG. 4, the ion beam is mass analyzed, wherein ions of a desired charge-to-mass ratio are selected. In act 206, the ion beam is electrostatically modified, wherein the ion beam is generally concurrently electrostatically parallelized, deflected, decelerated, and filtered via a combined electrostatic lens system.

Electrostatically modifying the ion beam in act 206, for example, may comprise deflecting a path of the ion beam and filtering contaminants from the ion beam, while concurrently decelerating and parallelizing the ion beam into a plurality of parallel beamlets, such that the plurality of parallel beamlets travel at a decelerated speed. In another example, forming the ion beam in act 202, for example, comprises a forming a spot beam, wherein the method further comprises scanning the ion beam prior to electrostatically modifying the ion beam in act 206, therein defining a scanned ion beam. Accordingly, electrostatically modifying the ion beam in act 206 further comprises parallelizing the scanned ion beam as well as deflecting a path of the ion beam and filtering contaminants from the ion beam, while concurrently decelerating the ion beam. In act 208, the ion beam impacts a workpiece, wherein ions are implanted into the workpiece, wherein the workpiece, for example, may be scanned through the ion beam in one or more directions.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion implantation system, comprising:
an ion source and extraction assembly configured to generate an ion beam;
a mass-analysis magnet assembly configured to mass resolve the ion beam;
a mass resolving aperture positioned downstream of the mass-analysis magnet assembly, wherein the mass resolving aperture is configured to filter undesirable species from the ion beam, and wherein the ion beam generally diverges after passing through the mass resolving aperture;
a combined electrostatic lens system positioned downstream of the mass-analysis magnet assembly, wherein a path of the ion beam is deflected and contaminants are generally filtered out of the ion beam, while concurrently decelerating and parallelizing the ion beam, wherein the combined electrostatic lens system comprises a plurality of electrodes including a top terminal suppression electrode and a bottom terminal suppression electrode, wherein a curvature of a downstream edge the top terminal suppression electrode differs from a curvature of a downstream edge of the bottom terminal suppression electrode; and
a workpiece holder and translation system positioned downstream of the combined electrostatic lens system and configured to selectively translate a workpiece in one or more directions through the ion beam.

2. The ion implantation system of claim 1, wherein the ion beam generated by the ion source comprises a spot ion beam, and wherein the ion implantation system further comprises a scanner apparatus positioned downstream of the mass-analysis magnet assembly, wherein the scanner apparatus is configured to scan the spot ion beam along a single beam scan plane, therein defining a scanned ion beam.

3. The ion implantation system of claim 1, wherein the ion beam generated by the ion source comprises a ribbon beam.

4. The ion implantation system of claim 3, wherein the ion source and extraction assembly comprises an elongate extraction aperture, therein defining the ribbon beam.

5. The ion implantation system of claim 1, further comprising a focusing element positioned downstream of the mass resolving aperture and upstream of the combined electrostatic lens system, wherein the focusing element generally determines a size of the ion beam.

6. The ion implantation system of claim 1, further comprising a controller configured to control one or more of the ion source and extraction assembly, mass-analysis magnet assembly, mass resolving aperture, combined electrostatic lens system, and workpiece holder and translation system, based, at least in part, on a desired dosage of ions to be implanted into the workpiece.

7. The ion implantation system of claim 1, wherein the combined electrostatic lens system comprises a decelerating filter configured to selectively decelerate the ion beam.

8. The ion implantation system of claim 1, further comprising a beam and workpiece neutralization system positioned downstream of the combined electrostatic lens system, wherein the beam and workpiece neutralization system is configured to space-charge neutralize the ion beam.

9. The ion implantation system of claim 8, wherein the beam and workpiece neutralization system is configured to provide workpiece charge control.

10. The ion implantation system of claim 8, wherein the beam and workpiece neutralization system comprises a plasma electron flood system.

11. The ion implantation system of claim 1, further comprising an energy resolving system positioned between the combined electrostatic lens system and the workpiece, wherein an energy of the ion beam is made uniform by filtering ions having undesirable energies from the ion beam.

12. The ion implantation system of claim 1, wherein the plurality of electrodes of the combined electrostatic lens system are configured to concurrently parallelize, decelerate, deflect, and filter the ion beam.

13. An ion implantation system, comprising:
an ion source and extraction assembly configured to generate an ion beam;
a mass-analysis magnet assembly configured to mass resolve the ion beam;
a mass resolving aperture positioned downstream of the mass-analysis magnet assembly, wherein the mass resolving aperture is configured to filter undesirable species from the ion beam, and wherein the ion beam generally diverges after passing through the mass resolving aperture;
a combined electrostatic lens system positioned downstream of the mass-analysis magnet assembly, wherein a path of the ion beam is deflected and contaminants are generally filtered out of the ion beam, while concurrently decelerating and parallelizing the ion beam, wherein the combined electrostatic lens system comprises a plurality of electrodes configured to concurrently parallelize, decelerate, deflect, and filter the ion beam, and wherein the plurality of electrodes comprise a top terminal suppression electrode and a bottom terminal suppression electrode, wherein a curvature of a downstream edge the top terminal suppression electrode differs from a curvature of a downstream edge of the bottom terminal suppression electrode; and
a workpiece holder and translation system positioned downstream of the combined electrostatic lens system and configured to selectively translate a workpiece in one or more directions through the ion beam.

14. The ion implantation system of claim 13, wherein the plurality of electrodes further comprise a top bend electrode positioned downstream of the top terminal suppression electrode and a bottom bend electrode positioned downstream of the bottom terminal suppression electrode, where a curvature of an upstream edge of the top bend electrode differs from a curvature of an upstream edge of the bottom bend electrode.

15. The ion implantation system of claim 14, wherein the plurality of electrodes further comprise one or more ground electrodes positioned downstream of the top bend electrode and bottom bend electrode.

16. A method of implanting ions into a workpiece in an ion implantation system, the method comprising:
forming an ion beam;
mass analyzing the ion beam;
passing the ion beam through a combined electrostatic lens system comprising a plurality of electrodes including a top terminal suppression electrode and a bottom terminal suppression electrode, wherein a curvature of a downstream edge the top terminal suppression electrode differs from a curvature of a downstream edge of the bottom terminal suppression electrode for electrostatically modifying the ion beam, wherein the ion beam is generally concurrently electrostatically parallelized, deflected, decelerated, and filtered via a combined electrostatic lens system; and
scanning the workpiece through the ion beam, therein implanting ions into the workpiece.

17. The method of claim 16, wherein electrostatically modifying the ion beam comprises deflecting a path of the ion beam and filtering contaminants from the ion beam, while concurrently decelerating and parallelizing the ion beam into a plurality of parallel beamlets.

18. The method of claim 16, further comprising space-charge neutralizing one or more of the ion beam and workpiece after electrostatically modifying the ion beam via a plasma electron flood.

19. The method of claim 16, wherein ion beam comprises a low-energy ribbon beam.

20. The method of claim 16, wherein forming the ion beam comprises a forming a spot beam, wherein the method further comprises scanning the ion beam prior to electrostatically modifying the ion beam, therein defining a scanned ion beam, and wherein electrostatically modifying the ion beam comprises parallelizing the scanned ion beam into a plurality of parallel beamlets that travel at a decelerated speed and from which contaminants are generally removed.

* * * * *